United States Patent [19]

Sasaki

[11] Patent Number: 5,438,537
[45] Date of Patent: Aug. 1, 1995

[54] STATIC RANDOM ACCESS MEMORY WHICH HAS A PAIR OF THIN FILM TRANSISTORS AND WHEREIN THE CAPACITANCE AND RESISTANCE BETWEEN THE GATE ELECTRODES AND THE CONDUCTOR LAYERS ARE INCREASED SO AS TO REDUCE THE TIME CONSTANT BETWEEN THEM

[75] Inventor: Masayoshi Sasaki, Tokyo, Japan

[73] Assignee: Sony Corporation, Tokyo, Japan

[21] Appl. No.: 19,439

[22] Filed: Feb. 18, 1993

[30] Foreign Application Priority Data

Feb. 25, 1992 [JP] Japan .................................. 4-075156

[51] Int. Cl.6 .............................................. G11C 11/00
[52] U.S. Cl. ..................................... 365/154; 365/161; 257/66; 257/359; 257/903
[58] Field of Search ..................... 257/66, 67, 69, 359, 257/903; 365/87, 154, 161

[56] References Cited

U.S. PATENT DOCUMENTS 4,805,147 2/1989 Yamanaka et al. ................. 365/154
4,956,814 9/1990 Houston ............................... 365/154
5,162,889 11/1992 Itomi .................................... 251/903
5,194,749 3/1993 Meguro et al. ..................... 257/903

*Primary Examiner*—Joseph A. Popek
*Assistant Examiner*—F. Niranjan
*Attorney, Agent, or Firm*—Hill, Steadman & Simpson

[57] ABSTRACT

A static random access memory of the thin film transistor load type which is enhanced in soft error resistance without involving an increase of the area of a cell is disclosed. A conductor layer is connected to the gate electrode of a first one of a pair of thin film transistors which serve as load means of each cell and is formed as a different layer from the first thin film transistor. The conductor layer is layered on a conductor layer of the other second thin film transistor with an insulating layer interposed therebetween to form a coupling capacity between the conductor layer connected to the gate electrode of the first thin film transistor and the conductor layer of the second thin film transistor. Resistors are interposed between the gates and active layers of the first and second thin film transistors and storage nodes connected to the first and second thin film transistors.

1 Claim, 6 Drawing Sheets

STATIC RANDOM ACCESS MEMORY WHICH HAS A PAIR OF THIN FILM TRANSISTORS AND WHEREIN THE CAPACITANCE AND RESISTANCE BETWEEN THE GATE ELECTRODES AND THE CONDUCTOR LAYERS ARE INCREASED SO AS TO REDUCE THE TIME CONSTANT BETWEEN THEM

BACKGROUND OF THE INVENTION

1. Field of the Invention

This invention relates to a static random access memory (SRAM) of the thin film transistor (TFT) load type, and more particularly to a static random accessory of the thin film transistor load type having an enhanced soft error resistance.

2. Description of the Related Art

A conventional static random access memory of the thin film transistor type includes a large number of memory cells normally having such a circuit configuration as shown in FIG. 1 and having such a layout as shown, for example, in FIG. 2 and such a sectional structure as shown, for example, in FIG. 3.

Referring to FIGS. 2 and 3, reference character 3P denotes the gate electrode of a p-channel MOS (metal oxide semiconductor) thin film transistor formed from a third polycrystalline silicon layer and serving as load means. Reference character 3PC denotes a contact portion of the gate electrode 3P with the gate electrode of an n-channel MOS transistor which serves as a driver transistor, and 4P denotes a fourth polycrystalline silicon layer, on which the thin film transistor having the gate electrode 3P is formed. In particular, the polycrystalline silicon layer 4P acts as an active layer of the thin film transistor, and reference character 4PC denotes a contact portion of the polycrystalline silicon layer 4P with the gate electrode 3P.

The static random access memory of the thin film transistor load type of the construction described above is advantageous in that, since a bulk n-channel MOS transistor is employed as a driver and a p-channel MOS field effect transistor (FET) is employed as load means so that a pair of invertors forming a flip-flop have a CMOS (complementary metal oxide semiconductor) invertor configuration, the current flowing through the cell can be restricted low. It is to be noted that various proposals have been made for such static random access memories, for example, by Japanese Utility Model Laid-Open Application No. 2-146849.

The conventional static random access memory of the thin film transistor load type having such a construction as described above, however, is disadvantageous in that the soft error resistance thereof cannot be made very high since the driving capacity of a thin film transistor serving as load means is low.

In particular, while RAMs have a problem that, if α-rays which are generated by decay of radioactive elements such as uranium contained very little in the material of wiring lines are introduced to a storage node of a cell which is in the state of a "high" potential, then an electron-positive hole pair is produced by a range of the α-rays and fluctuates the potential at the storage node to cause a soft error of reversal of the flip-flop, and static random access memories of the so-called full CMOS type rarely experience from this problem.

This is because, even if a storage node is urged to vary its potential by an electron-positive hole pair generated by α-rays, current is supplied to the storage node from a p-channel bulk MOS transistor serving as the load MOS transistor so that the storage node can maintain its state of a "high" potential. In other words, since a bulk MOS transistor has a sufficient driving capacity, an otherwise possible variation of the storage node by α-rays can be prevented.

However, with regard to static random access memories of the thin film transistor load type, a soft error is becoming a problem. In particular, in addition to the fact that thin film transistors are originally low in current driving capacity, they have a tendency that the size thereof is decreased in order to achieve higher integration of memories, which further decreases the current driving capacity of the thin film transistors. Accordingly, it is getting difficult to anticipate that a p-channel thin film transistor serving as load means can supply such current as to prevent the fluctuation of the potential at a storage node from being caused by α-rays.

Therefore, a soft error, which has conventionally been a problem only with dynamic RAMs, becomes a problem also with static random access memories.

SUMMARY OF THE INVENTION

It is an object of the present invention to provide a static random access memory of the thin film transistor load type which has greater soft error resistance without involving an increase of the area of a cell.

In order to attain the object described above, there is provided a static random access memory of the thin film transistor load type, wherein a conductor layer connected to the gate electrode of a first one of a pair of thin film transistors which serve as the load means of each cell and which is formed as a different layer from the first thin film transistor is layered on a conductor layer of the other second thin film transistor with an insulating layer interposed therebetween to form a coupling capacity between the conductor layer connected to the gate electrode of the first thin film transistor and the conductor layer of the second thin film transistor, and resistors are interposed between the gates and active layers of the first and second thin film transistors and storage nodes connected to the first and second thin film transistors.

In the static random access memory of the thin film transistor load type, since the conductor layer is connected to the gate electrode of the first thin film transistor of each cell and layered on the gate electrode of the second thin film transistor of the cell with the insulating layer interposed therebetween, the coupling capacitor can be interposed between the gate electrodes of the first and second thin film transistors.

Further, the resistors are interposed between the gate electrodes and the active layers of the first and second thin film transistors and the storage nodes connected to the first and second thin film transistors. Accordingly, the CR time constant of the memory cell has such a high value that, even if a drop of potential at one of the storage nodes is caused by α-rays, the charge of the gate electrodes of the first and second thin film transistors does not disappear. Accordingly, reversal of data at the memory cell can be prevented.

The above and other objects, features and advantages of the present invention will become apparent from the following description and the appended claims, taken in conjunction with the accompanying drawings in which like parts or elements are denoted by like reference characters.

DETAILED DESCRIPTION OF THE PREFERRED EMBODIMENT

Figure 4:
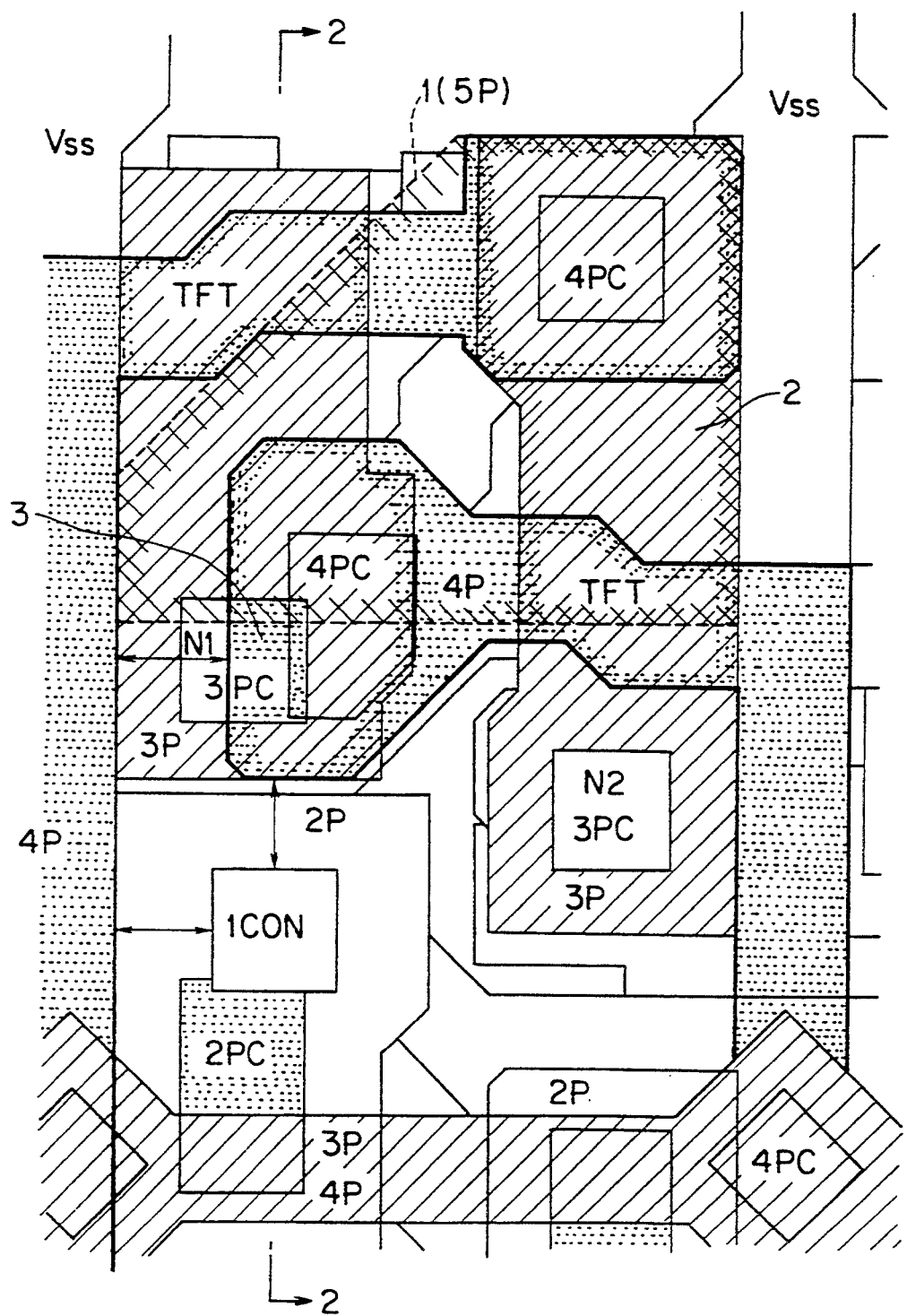
FIG. 4 is a schematic plan view of a static random access memory of the thin film transistor load type showing a preferred embodiment of the present invention.
Figure 5:
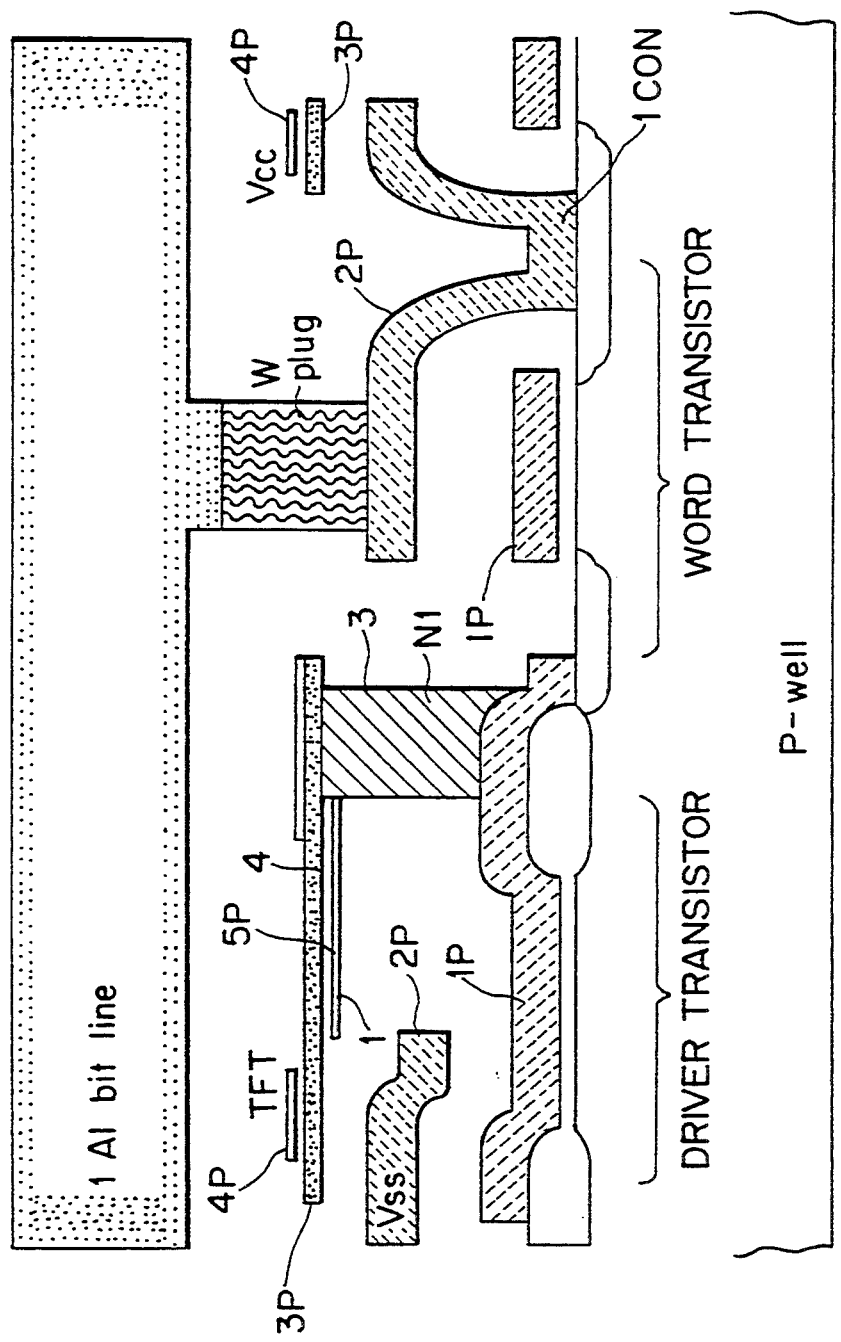
FIG. 5 is a schematic sectional view of the static random access memory taken along line 5—5 of FIG. 4.
Figure 6:
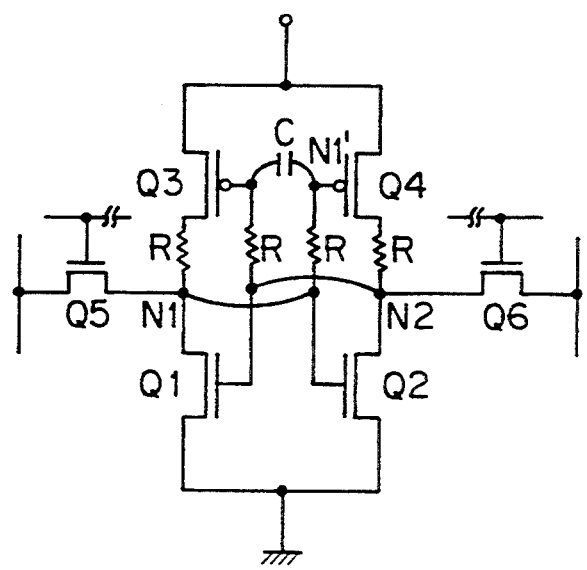
FIG. 6 is a circuit diagram of the static random access memory shown in FIG. 4.

Referring first to FIGS. 4 to 6, there is shown a static random access memory of the thin film transistor load type according to a preferred embodiment of the present invention. The static random access memory of the thin film transistor load type of the present embodiment is similar in configuration to the conventional static random access memory of the thin film transistor load type described hereinabove except that a fifth polycrystalline silicon layer is formed as a lower layer below a third polycrystalline silicon layer 3P and the contact between the third polycrystalline silicon layer 3P and a first polycrystalline silicon layer 1P is established by polycrystalline silicon filled in a contact hole. It is to be noted that detailed description of the common configuration between the static random access memory of the thin film transistor load type of the present embodiment and the conventional static random access memory of the thin film transistor load type will be omitted herein to avoid redundancy while only different features will be described below.

Reference character 1 denotes the fifth polycrystalline silicon layer (5P). The fifth polycrystalline silicon layer 1 (5P) is connected to a storage node N1 and extends below the gate electrode (3P) of a thin film transistor Q3. Reference numeral 2 denotes a portion at which the gate electrode (3P) of the thin film transistor Q3 and the fifth polycrystalline silicon layer 1 overlap with each other, and reference numeral 4 denotes an insulating layer for insulating the gate electrode (3P) of the thin film transistor Q3 and the fifth crystalline silicon layer 1 from each other. The insulating layer 4 is made of a layered film of, for example. SiO$_2$, Si$_3$N$_4$ and SiO$_2$.

A coupling capacitance C is formed at the overlapping portion 2.

The insulating film 4 has a film thickness of 10 nm when converted into that of a single layer of SiO$_2$. When designed with a 0.3 $\mu$m rule, the coupling capacitance C is 3.4 fF or so. Such value of the capacitance C is equivalent to the total capacity of the storage node N1 (N2) when the coupling capacitance C is not provided.

In this manner, in the present static random access memory of the thin film transistor load type, the polycrystalline silicon layer 1 connected to the storage node N1 is layered below the gate electrode (3P) of the thin film transistor Q3 with the layered insulating layer 4 interposed therebetween, and the coupling capacitance C is constructed between the gate electrode (3P) and the polycrystalline silicon layer 1. This signifies that the coupling capacitor C is connected between the gate electrodes of the thin film transistors Q3 and Q4 as shown in FIG. 6.

Further, the connection of the polycrystalline silicon layer 1 and a polycrystalline silicon layer 4P which makes an active layer of a thin film transistor to the storage node N1 is established by polycrystalline silicon 3 filled in a contact hole 3PC provided for allowing the contact between the polycrystalline silicon layers 1P and 3P.

The contact resistance of the polycrystalline silicon 3 can be set to an arbitrary value by suitably setting the ion implantation amount of an impurity such as, for example, phosphorus. For example, the contact resistance R of 500 k$\Omega$ can be obtained by implantation of phosphorus by, for example, $3 \times 10^{13}/cm^3$.

Figure 1:
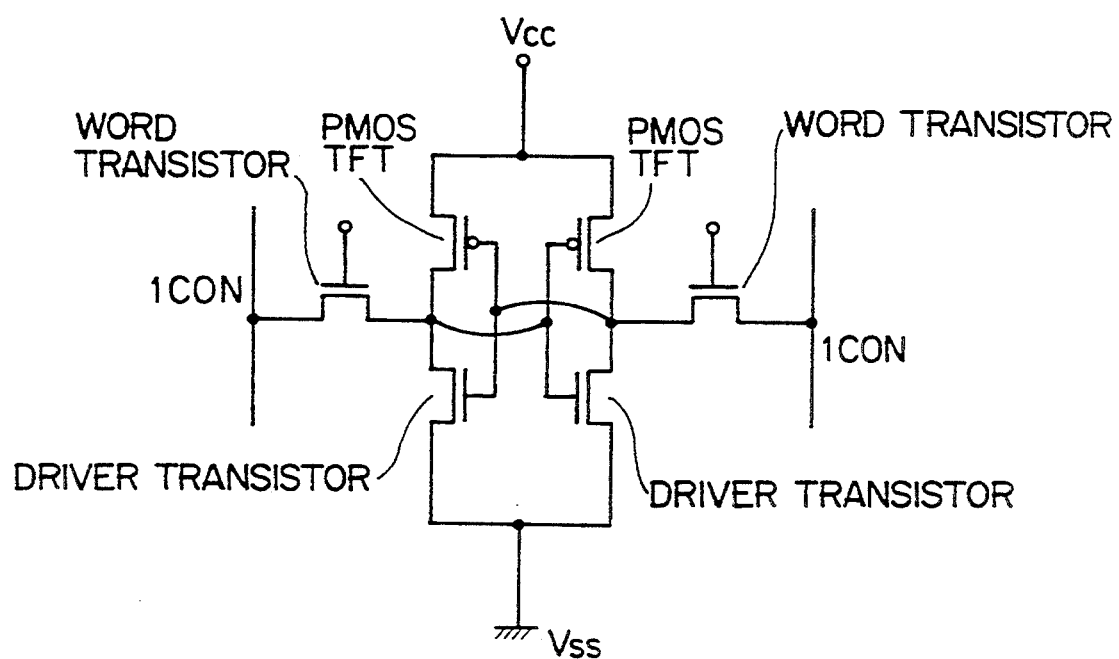
FIG. 1 is a circuit diagram showing a conventional static random access memory of the thin film transistor load type.
Figure 2:
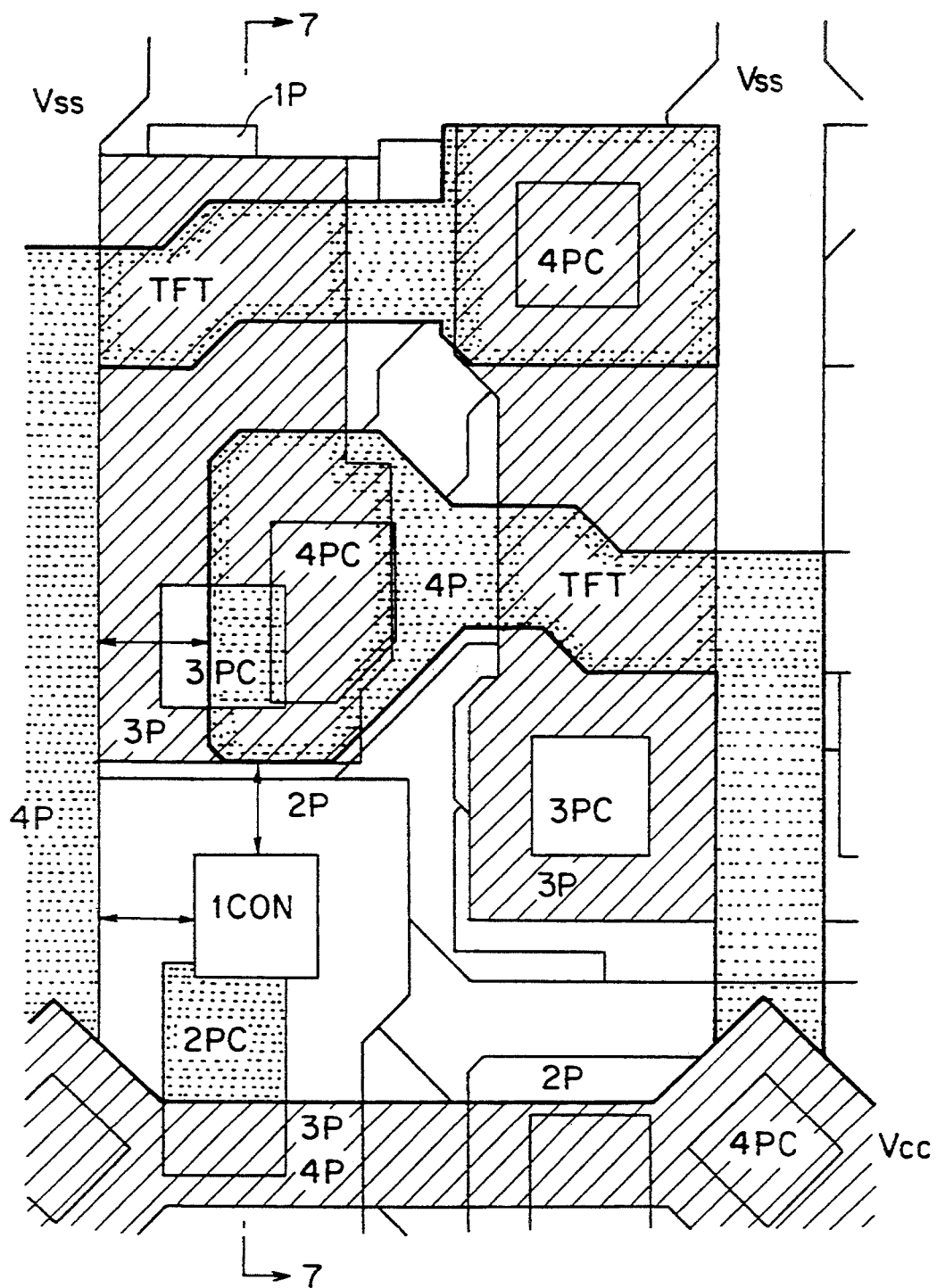
FIG. 2 is a schematic plan view of the static random access memory shown in FIG. 1.
Figure 3:
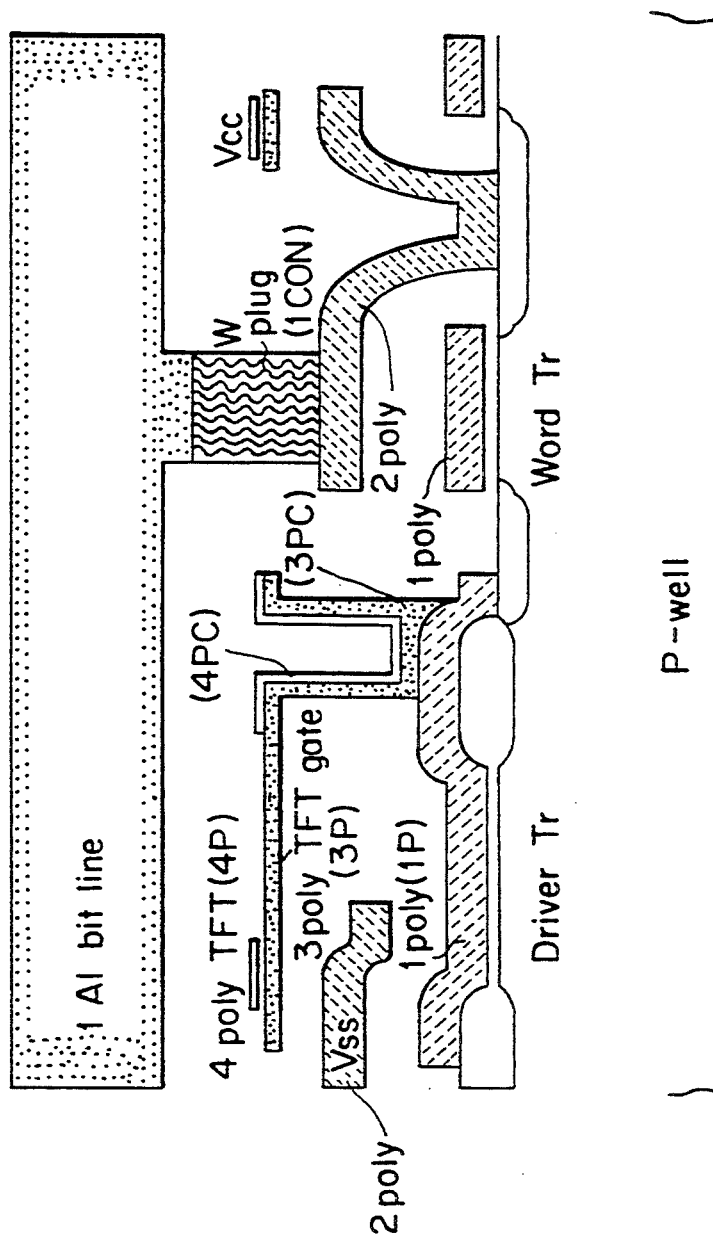
FIG. 3 is a schematic sectional view of the static random access memory taken along line 7—7 of FIG. 2.

In this connection, the connection of the gate and the active layer of a thin film transistor to a storage node is conventionally established by direct contact as shown in FIG. 3. Accordingly, such contact resistance R as described above cannot actually be obtained.

With the present static random access memory of the thin film transistor load type, the CR time constant of a memory cell can be made a significantly high value, and the soft error resistance can be enhanced.

Figure 7:
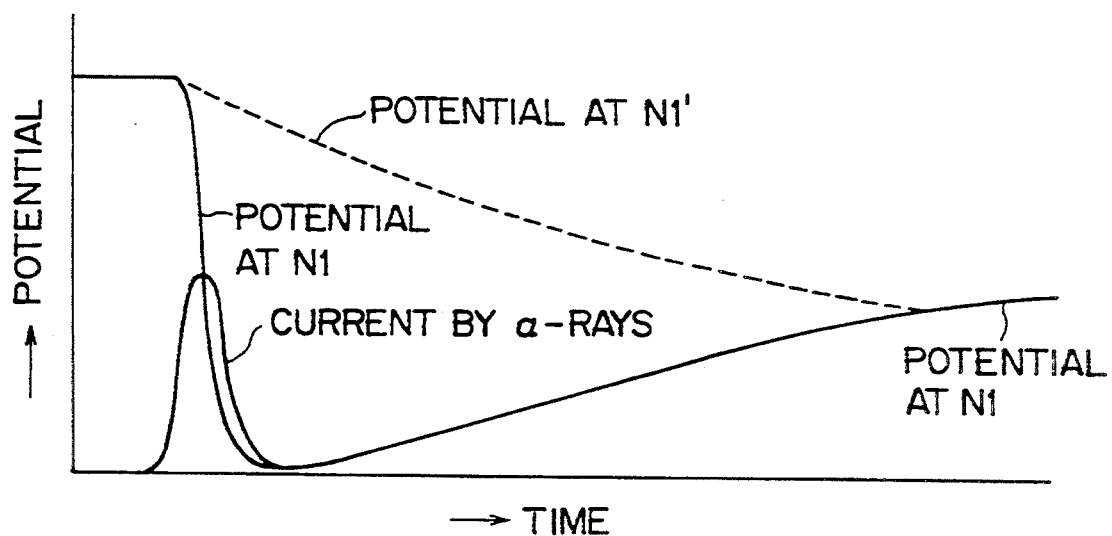
FIG. 7 is a diagram showing the variation of the potential at a storage node of the static random access memory of the present invention caused by $\alpha$-rays.

This will be described with reference to FIG. 7 taking notice of the storage node N1. It is to be noted that the gate electrode of a thin film transistor Q4 is denoted as N1'.

It is assumed here that $\alpha$-rays come into the semiconductor substrate so that electrons are implanted into the storage node N1 at a "high" level. The potential at the storage node N1 then drops from a power source voltage Vcc to 0 volt in about 100 ps (picoseconds). Electrons generated from the $\alpha$-rays thus flow into the storage node N1 in 100 ps at the utmost.

Meanwhile, current flows from the third polycrystalline silicon layer 3P connected to the storage node N1 and the fifth polycrystalline silicon layer 1 (5P) to the storage node N1 through a portion in which the time constant CR is determined by the coupling capacity C and the contact resistance R. The time constant CR is about $1.5 \times 10^{-9}$ sec (in the case C=3 fF and R=500 k$\Omega$).

Accordingly, even if the potential at the storage node N1 drops to 0 volt in 100 ps, the drop is slow and small because the time constant is high. Then, after the time of 100 ps has elapsed, the potential at the node N1 begins to rise and also the potential at the node N1' begins to rise. The MOS transistor Q4 is controlled by the potential at the node N1', and since the potential at the node N1' does not become low, reversal of data at the memory cell can be prevented.

In this connection, if the coupling capacitance C and the contact resistance R are low, then since the potential at the storage node N1' will drop suddenly in response to a drop of the potential at the storage node N1 by invasion of electrons generated by $\alpha$-rays until it is reduced to 0 or to a value near 0, the MOS transistor Q4 may possibly be turned on to cause reversal of data, but this can be prevented where the time constant CR has a high value as in the present invention.

As described so far, according to the present invention, a static random access memory of the thin film transistor load type is constructed such that a conductor layer connected to the gate electrode of a first one of a pair of thin film transistors which serve as load means of each cell and formed as a different layer from the first thin film transistor is layered on a conductor layer of the other second thin film transistor with an insulating layer interposed therebetween to form a coupling capacity between the conductor layer connected to the gate electrode of the first thin film transistor and the conductor layer of the second thin film transistor, and resistors are interposed between the gates and active layers of the first and second thin film transistors and storage nodes connected to the first and second thin film transistors.

Accordingly, in the static random access memory of the thin film transistor load type, since the conductor layer is connected to the gate electrode of the first thin film transistor of each cell and layered on the gate electrode of the second thin film transistor of the cell with the insulating layer interposed therebetween, the coupling capacitor can be interposed between the gate electrodes of the first and second thin film transistors. Further, the contact resistors are interposed between the gate electrodes and the active layers of the first and second thin film transistors and the respective storage nodes.

Accordingly, the CR time constant of the memory cell has such a high value that, even if a drop of potential at one of the storage nodes is caused by α-rays, the charge of the gate electrodes of the first and second thin film transistors does not disappear. Accordingly, reversal of data at the memory cell can be prevented.

Having now fully described the invention, it will be apparent to one of ordinary skill in the art that many changes and modifications can be made thereto without departing from the spirit and scope of the invention as set forth herein.

What is claimed is:

1. A static random access memory of the thin film transistor load type comprising, first and second thin film load transistors, a pair of driver transistors, and a pair of word transistors, a first polycrystalline layer which forms the gate of said first thin film load transistor, a second polycrystalline layer which forms the gate of said second thin film load transistor, a third polycrystalline layer spaced from first and second polycrystalline layers and capacitively coupling them together and forming a coupling capacitance therebetween, fourth and fifth polycrystalline layers which, respectively, form the gates of said pair of driver transistors, a first resistor formed in a through-hole between said first and said fourth polycrystalline layer so as to resistively couple them together, and a second resistor formed in a through-hole between said second and fifth polycrystalline layer so as to resistively couple them together, and wherein the product of the coupling capacitance and the resistance of said first resistor defines a time constant which determines the response speed of said random access memory.

* * * * *